(12) United States Patent
Park et al.

(10) Patent No.: US 11,798,842 B2
(45) Date of Patent: Oct. 24, 2023

(54) LINE FORMATION WITH CUT-FIRST TIP DEFINITION

(71) Applicant: INTERNATIONAL BUSINESS MACHINES CORPORATION, Armonk, NY (US)

(72) Inventors: Chanro Park, Clifton Park, NY (US); Koichi Motoyama, Clifton Park, NY (US); Hsueh-Chung Chen, Cohoes, NY (US); Yann Mignot, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 90 days.

(21) Appl. No.: 17/482,939

(22) Filed: Sep. 23, 2021

(65) Prior Publication Data

US 2023/0090983 A1 Mar. 23, 2023

(51) Int. Cl.
*H01L 21/768* (2006.01)
*H01L 21/306* (2006.01)

(52) U.S. Cl.
CPC .. *H01L 21/76843* (2013.01); *H01L 21/30608* (2013.01); *H01L 21/7688* (2013.01); *H01L 21/76879* (2013.01); *H01L 21/76897* (2013.01)

(58) Field of Classification Search
CPC ......... H01L 21/76843; H01L 21/30608; H01L 21/76879; H01L 21/7688; H01L 21/76897
See application file for complete search history.

(56) References Cited

U.S. PATENT DOCUMENTS

| | | |
|---|---|---|
| 8,563,410 B2 | 10/2013 | Lin et al. |
| 9,425,049 B2 | 8/2016 | Huang et al. |
| 9,589,847 B1 | 3/2017 | Chi et al. |
| 10,020,223 B1 | 7/2018 | Anderson et al. |
| 10,229,850 B1 | 3/2019 | Bouche |
| 10,896,874 B2 | 1/2021 | Ning et al. |
| 11,024,511 B1 | 6/2021 | Chen |
| 2017/0140986 A1 | 5/2017 | Machkaoutsan et al. |
| 2020/0312764 A1* | 10/2020 | Ning ............ H01L 23/5226 |
| 2020/0373199 A1* | 11/2020 | Cheng ........... H01L 23/5226 |
| 2021/0050261 A1 | 2/2021 | Lin et al. |

* cited by examiner

*Primary Examiner* — Thanhha S Pham
(74) *Attorney, Agent, or Firm* — Tutunjian & Bitetto, P.C.; Samuel Waldbaum (57) ABSTRACT

Semiconductor devices and methods of forming conductive lines in the same include forming a cut region in a first dielectric layer, the cut region having a first width. A second dielectric plug is formed in the cut region. A mask is formed, over the first dielectric layer, that defines at least one trench region that crosses the second dielectric plug, with the at least one trench region having a second width that is smaller than the first width. Material from the first dielectric layer in the trench regions is etched away, using a selective anisotropic etch that leaves the second dielectric plug in place, to form trenches in the first dielectric layer. Conductive material is deposited in the trenches to form conductive lines that are separated by the second dielectric plug.

17 Claims, 5 Drawing Sheets

LINE FORMATION WITH CUT-FIRST TIP DEFINITION

BACKGROUND

The present invention generally relates to integrated chip fabrication, and, more particularly, to formation of conductive lines in an integrated chip.

Back-end-of-line fabrication processes create interconnect structures that provide electrical connectivity to front-end-of-line devices. Such structures may include conductive lines. However, as line pitch decreases, controlling the placement of line tips becomes more challenging, and the risk of shorts rises.

SUMMARY

A method for forming conductive lines in a semiconductor device includes forming a cut region in a first dielectric layer, the cut region having a first width. A second dielectric plug is formed in the cut region. A mask is formed, over the first dielectric layer, that defines at least one trench region that crosses the second dielectric plug, with the at least one trench region having a second width that is smaller than the first width. Material from the first dielectric layer in the trench regions is etched away, using a selective anisotropic etch that leaves the second dielectric plug in place, to form trenches in the first dielectric layer. Conductive material is deposited in the trenches to form conductive lines that are separated by the second dielectric plug.

A method for forming conductive lines in a semiconductor device includes forming a cut region in a first dielectric layer, the cut region having a first width. A second dielectric plug is deposited in the cut region. A mask is formed, over the first dielectric layer, that defines parallel trench regions, one of which crosses the second dielectric plug, with each of the trench regions having a second width that is smaller than the first width. Material is etched away from the first dielectric layer in the trench regions, using a selective anisotropic etch that leaves the second dielectric plug in place, to form trenches in the first dielectric layer. Conductive material is deposited in the trenches to form parallel conductive lines, with at least a pair of the parallel conductive lines being positioned end-to-end, separated by the second dielectric plug A semiconductor device includes a dielectric layer, positioned on an underlying layer, having trenches. A dielectric plug is in a first trench, separating the first trench into a pair of end-to-end trenches, the dielectric plug having a first width. Conductive lines are in the trenches, each of the conductive lines having a second width that is smaller than the first width.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

The formation of conductive interconnects in a back-end-of-line portion of an integrated chip provides electrical communication between different front-end-of-line devices on the chip. While these conductive interconnects may be relatively simple structures, they make possible substantial functional complexity by interconnecting devices that may be distant from one another on the integrated chip. Such interconnects may be formed in a layer of dielectric material, for example by forming trenches in the dielectric material and filling the trenches with conductive material.

The interconnects may have various configurations, to provide electrical contact between the front-end-of-line devices. For example, there may be multiple parallel conductive lines in a given back-end-of-line layer, and these may include lines that are arranged adjacent to one another, both laterally and end-to-end. To form end-to-end adjacent conductive lines, conductive material may be deposited in a straight line, with a cut region separating the conductive material into end-to-end lines.

Rather than forming trenches in the dielectric layer first, and then forming cuts after conductive material has been deposited, cut structures may be formed before the trenches are formed. As will be described in greater detail below, the cut structure may be formed by introducing a dielectric plug, so that trench etch will create end-to-end trenches on respective sides of the dielectric plug. These cut structures may provide well-defined tip locations for the lines that are formed using the trenches, with lower risk of shorting, lower risk of dielectric damage, and simpler manufacturing processes.

Figure 1:
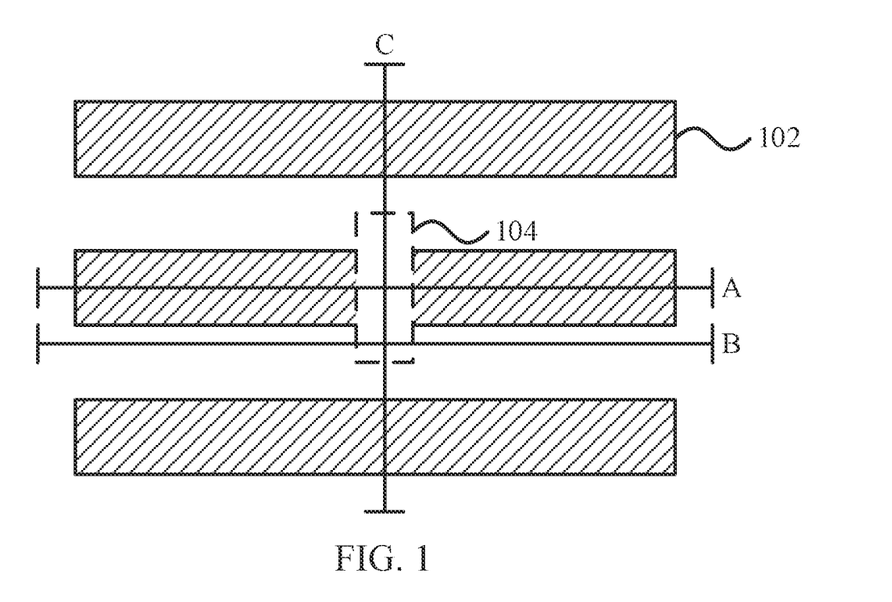
FIG. 1 is a top-down view of a set of parallel conductive lines, with one of the conductive lines having a cut region that is defined before the parallel conductive lines are formed, the view defining cross-sectional views A, B, and C, in accordance with an embodiment of the present invention.

Referring now to FIG. 1, a top-down view of a set of conductive lines 102 is shown. The conductive lines 102 are shown in parallel. The space between each pair of conductive lines 102, in combination with the width of the conductive lines themselves, represents the pitch. This pitch may have a lower limit that is defined by the limits of the lithographic technology that is used to fabricate the device. One of the conductive lines 102 is interrupted by a cut region 104. This cut region 104 separates the conductive line 102 into two parts, thus creating two conductive lines in an end-to-end arrangement.

Three different cross-sectional views are indicated, including views A, B, and C. View A shows a view along the length of the conductive line 102 that has cut region 104. View B shows a view parallel to the length of the conductive lines 102, formed in a gap between lines 102, that also passes through the cut region 104. View C shows a view that is perpendicular to the length of the conductive lines 102 and that passes through the cut region 104. In the following figures, these views will be shown side-by-side for each step of the fabrication process.

Figure 2:
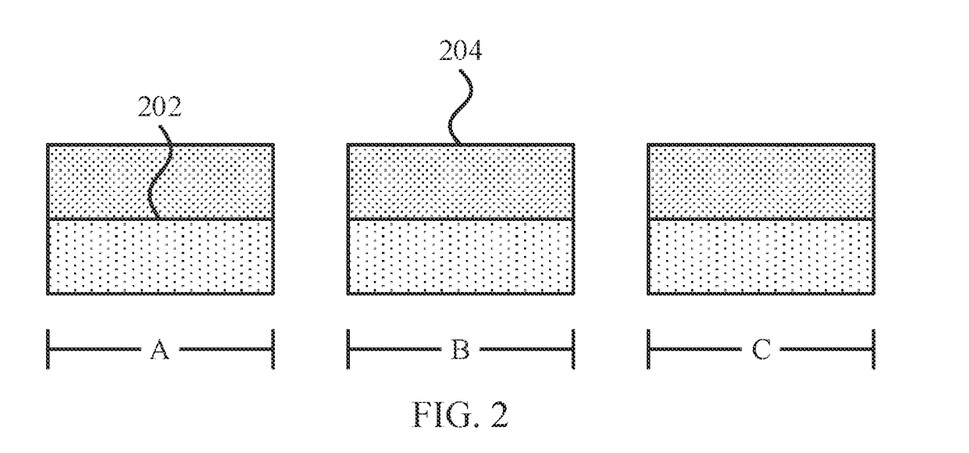
FIG. 2 is a set of cross-sectional views (A, B, and C) of a step in the fabrication of conductive lines in an integrated chip, showing the formation of a first dielectric layer over an underlying layer, in accordance with an embodiment of the present invention.

Referring now to FIG. 2, a set of cross-sectional views A, B, and C are shown for a step in the fabrication of conductive lines. A layer of dielectric material 204 is formed over an underlying layer 202. In some cases, the underlying layer 202 may be a semiconductor substrate. In other cases, the underlying layer 202 may be a device layer, which may include a variety of active or passive circuit components. The underlying layer 202 may further include multiple distinct layers, including any appropriate combination of a semiconductor substrate, a device layer, an interconnect layer, and any other layer of an integrated chip. In some embodiments, the underlying layer 202 may include front-end-of-line devices, and the dielectric layer 204 may be a back-end-of-line layer.

The underlying layer 202 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the underlying layer may also be a semiconductor on insulator (SOI) substrate.

The dielectric layer 204 may be formed from any appropriate first dielectric material. This material will form dielectric spacers between the conductive lines that will be formed in subsequent steps, so the dielectric material may be selected for its electrical properties. In particular, a low-k dielectric material may be used, to reduce parasitic capacitance between the conductive lines. Exemplary low-k dielectric materials that may be used include SiCOH, with a dielectric constant between about 2.7 and about 3.0, and exemplary ultra-low-k dielectric materials include octamethylcyclotetrasiloxane, with a dielectric constant of about 2.7.

As used herein, the term "low-k" refers to a dielectric material that has a dielectric constant k that is lower than the dielectric constant of silicon dioxide. Reduction of capacitance is of significant concern as fabrication technologies improve and device pitch continues to scale down. Stray capacitances in an integrated chip can limit the performance of the chip, particularly in high-frequency applications, and cause unwanted resonance with any inductances present in the chip. For example, a pair of adjacent conductive lines may be modeled as a parallel plate capacitor, with each conductive line being represented as one plate of the capacitor. The capacitance between the lines may therefore be expressed as:

$$C = \frac{k\varepsilon_0 A}{d}$$

where A is the area of the plates, d is the distance between the plates, $\varepsilon_0$ is the permittivity of free space, and k is the dielectric constant of the material between the plates. The capacitance is therefore inversely proportional to the distance between the plates—as device size scales down and the pitch between lines decreases, the capacitance between the lines increases. However, capacitance is also proportional to the dielectric constant k. Thus, the use of low-k dielectric material can substantially reduce the overall capacitance.

However, low-k dielectric materials may be susceptible to damage from etching processes. For example, in a patterning process that uses sacrificial material in trenches to define trench cuts, the etch that removes the sacrificial material, such as a plasma etch, can damage the sidewalls of the low-k dielectric, as will be described in greater detail below. This damage can be difficult to remove, and is best avoided.

Figure 3:
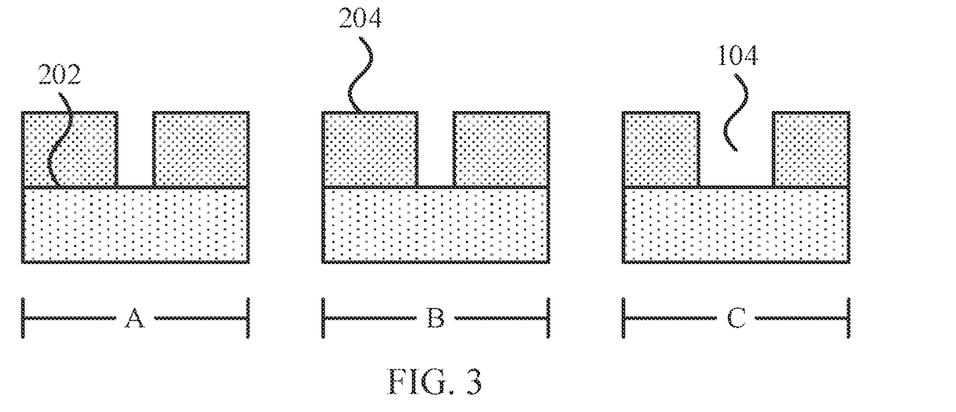
FIG. 3 is a set of cross-sectional views (A, B, and C) of a step in the fabrication of conductive lines in an integrated chip, showing the formation of a cut region in the first dielectric layer, in accordance with an embodiment of the present invention.

Referring now to FIG. 3, a set of cross-sectional views A, B, and C are shown for a step in the fabrication of conductive lines. Cut region 104 is formed in the dielectric layer 204. The cut region 104 may be formed by any appropriate patterning process. For example, a mask may be formed using a photolithographic process, whereby a mask material may be deposited and subsequently may be patterned by exposure to an appropriate wavelength of light, which causes the mask material to cure. Uncured mask material may then be removed, leaving behind a pattern mask that can be used to form the cut region 104, using an anisotropic etch process. The mask material can then be removed, leaving the dielectric layer 204 exposed.

As can be seen, the width of the cut region 104 in the C cross-section may be larger than the width shown in the A and B cross-sections. Because there is no confinement from neighboring lines, this width may exceed the width of the conductive line that will ultimately be formed. Thus, the width of the cut region 104 in the C direction may be less than 1.5 times the pitch between the conductive lines.

It is specifically contemplated that the etch used to form the cut region 104 should be anisotropic, but the etch need not be especially selective. The present embodiments are tolerant to over-etching at this stage, as cutting into the substrate 202 will simply produce a dielectric plug between adjacent conductive lines that is deeper than expected.

Figure 4:
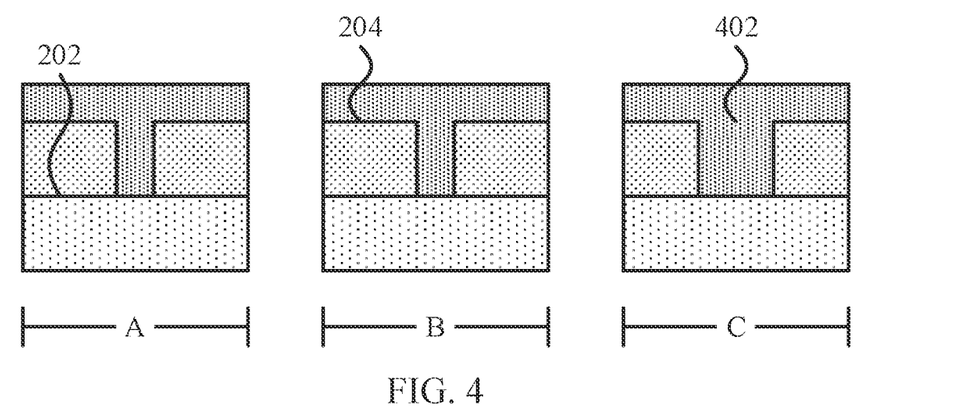
FIG. 4 is a set of cross-sectional views (A, B, and C) of a step in the fabrication of conductive lines in an integrated chip, showing the formation of a second dielectric material over the surface of the first dielectric layer and in the cut region, in accordance with an embodiment of the present invention.

Referring now to FIG. 4, a set of cross-sectional views A, B, and C are shown for a step in the fabrication of conductive lines. A layer of second dielectric material 402 is deposited over the dielectric layer 204, filling the cut region 104. This second dielectric material may be a material that is distinct from, and selectively etchable with respect to, the first dielectric material. Exemplary materials that may be used for the layer 402 may include aluminum oxide, silicon nitride, or an aluminum oxide/silicon nitride bi-layer. As used herein, the term "selective" in reference to a material removal process denotes that the rate of material removal for a first material is greater than the rate of removal for at least another material of the structure to which the material removal process is being applied.

The layer of second dielectric material 402 may be formed by any appropriate process including, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. to about 400° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Figure 5:
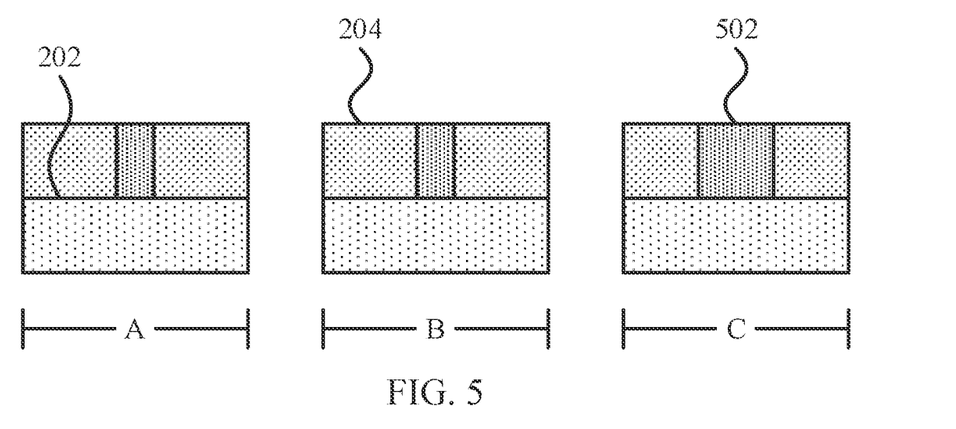
FIG. 5 is a set of cross-sectional views (A, B, and C) of a step in the fabrication of conductive lines in an integrated chip, showing excess second dielectric material having been polished away to form a dielectric plug in the cut region, in accordance with an embodiment of the present invention.

Referring now to FIG. 5, a set of cross-sectional views A, B, and C are shown for a step in the fabrication of conductive lines. The excess second dielectric material is polished away from above the dielectric layer 204, leaving dielectric plug 502 in the cut region 104, formed from the second dielectric material. The dielectric plug establishes a region where subsequent conductive line formation will not take place, so that lines that cross the dielectric plug will be broken into end-to-end lines.

This polishing may be performed using chemical mechanical planarization (CMP). CMP is performed using, e.g., a chemical or granular slurry and mechanical force to gradually remove upper layers of the device. The slurry may be formulated to be unable to dissolve, for example, the dielectric layer 204, resulting in the CMP process's inability to proceed any farther than that layer, so that the polishing process removes excess material without affecting the second dielectric material that is located within the cut region 104.

Figure 6:
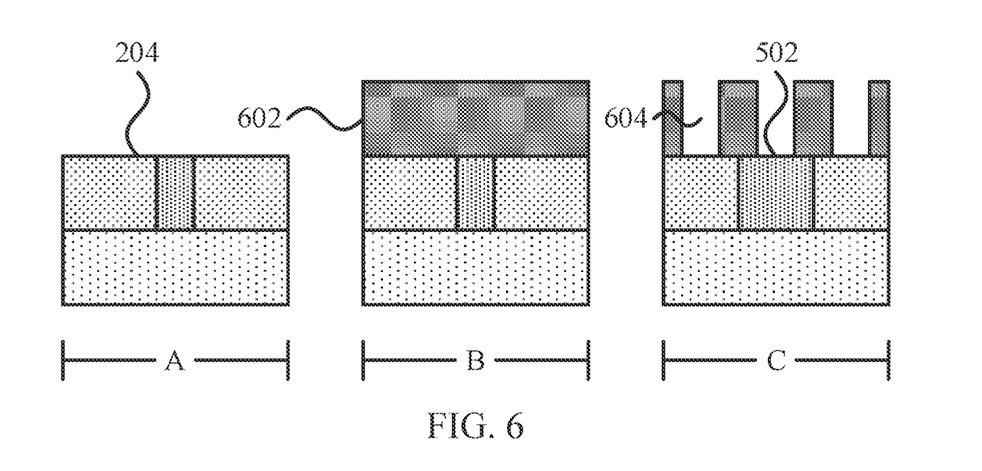
FIG. 6 is a set of cross-sectional views (A, B, and C) of a step in the fabrication of conductive lines in an integrated chip, showing the formation of a mask over the first dielectric layer that establishes trench regions, in accordance with an embodiment of the present invention.

Referring now to FIG. 6, a set of cross-sectional views A, B, and C are shown for a step in the fabrication of conductive lines. A mask 602 is formed, for example using an appropriate photolithographic process. The mask 602 defines open regions 604, which expose portions of the surface of the dielectric layer 204 and the dielectric plug 502. These open regions 604 correspond to trench regions, which will be etched down into the dielectric layer 204. Thus, the open regions 604 may include a set of parallel lines that represent conductive lines to be formed in a back-end-of-line layer. As can be seen in cross-section A, at least one open region 604 may cross over the dielectric plug 502.

Figure 7:
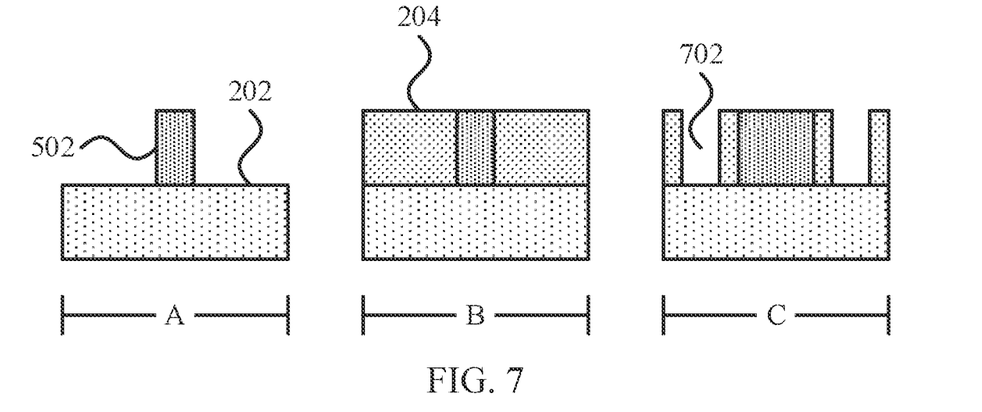
FIG. 7 is a set of cross-sectional views (A, B, and C) of a step in the fabrication of conductive lines in an integrated chip, showing the formation of a trenches in first dielectric layer, using the trench regions defined by the mask as a pattern for an anisotropic etch, in accordance with an embodiment of the present invention.

Referring now to FIG. 7, a set of cross-sectional views A, B, and C are shown for a step in the fabrication of conductive lines. A selective anisotropic etch is performed, using the pattern defined by the open regions 604 of the mask 602, to pattern the dielectric layer 204 and to form trenches 702. The selective anisotropic etch may selectively remove the first dielectric material, without substantially damaging the second dielectric material of the dielectric plug 502 and the underlying layer 202. The mask 602 may then be etched away, using any appropriate selective isotropic or anisotropic etching process, thereby exposing the unaffected portions of the dielectric layer 204.

Reactive Ion Etching (RIE) is a form of anisotropic plasma etching in which during etching the surface to be etched is placed on a radio-frequency powered electrode. Moreover, during RIE, the surface to be etched takes on a potential that accelerates the etching species extracted from plasma toward the surface, in which the chemical etching reaction is taking place in the direction normal to the surface. Other examples of anisotropic etching that can be used include ion beam etching, plasma etching or laser ablation.

As can be seen in cross-section C, the selective anisotropic etch forms trenches 702, but does not affect the dielectric plug 502. Thus, as can be seen in cross-section A, a trench 702 may be interrupted by such a dielectric plug 502, creating distinct trench sections on either side of the dielectric plug 502, in an end-to-end arrangement. The pre-existing dielectric plug 502 thereby provides for good control of the tip placement for any structures that are subsequently formed in the trenches 702.

Figure 8:
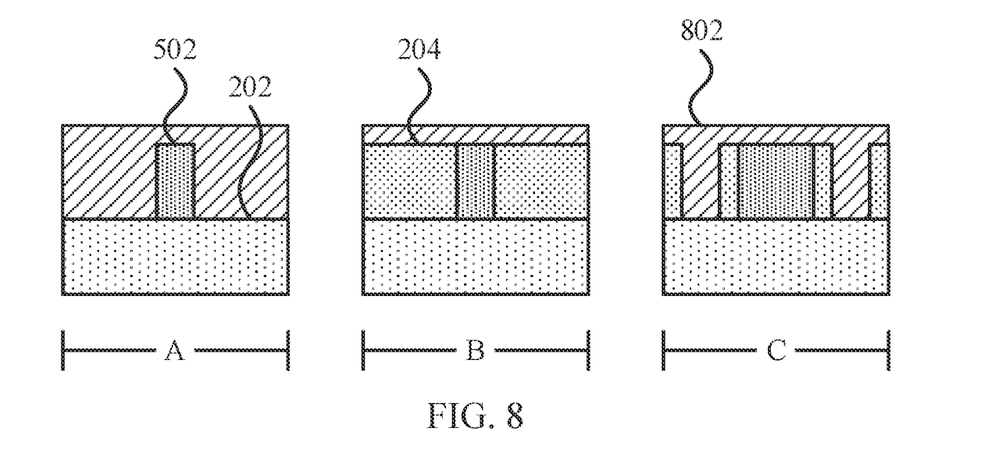
FIG. 8 is a set of cross-sectional views (A, B, and C) of a step in the fabrication of conductive lines in an integrated chip, showing the deposition of a layer of conductive material over the first dielectric layer and in the trenches, in accordance with an embodiment of the present invention.

Referring now to FIG. 8, a set of cross-sectional views A, B, and C are shown for a step in the fabrication of conductive lines. A layer of conductive material 802 is deposited over the dielectric layer 204 by any appropriate process, such as CVD, PVD, ALD, or GCIB deposition. The conductive material fills the trenches 702, and may be deposited to a height that extends above the top surface of the dielectric layer 204, thus leaving some excess conductive material on the top surface.

The conductive material 802 may be any appropriate metallic or non-metallic conductor. Appropriate conductive metals may include, e.g., aluminum, tungsten, nickel, titanium, molybdenum, tantalum, copper, platinum, silver, gold, ruthenium, iridium, rhenium, rhodium, cobalt, and alloys thereof. The conductive material 802 may alternatively be formed from a doped semiconductor material such as, e.g., doped polysilicon.

Figure 9:
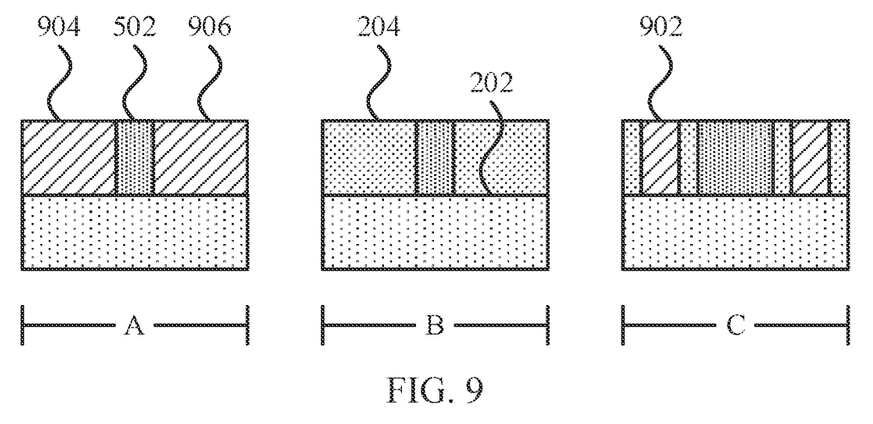
FIG. 9 is a set of cross-sectional views (A, B, and C) of a step in the fabrication of conductive lines in an integrated chip, showing the excess conductive material having been polished away to form conductive lines in the trenches, in accordance with an embodiment of the present invention.

Referring now to FIG. 9, a set of cross-sectional views A, B, and C are shown for a step in the fabrication of conductive lines. The layer of conductive material 802 may be polished down to the height of the dielectric layer 204 to remove any excess material that remains on the top surface of the dielectric layer 204, for example using a CMP process. This polishing process separates the remaining conductive material in the trenches 702, leaving conductive lines 902 in the trenches 702 of the dielectric layer 204. The dielectric plug 502 separates two distinct conductive lines 904 and 906 from one another. These two conductive lines 904 and 906 are positioned in an end-to-end arrangement.

The conductive lines 902 may form part of a back-end-of-line power distribution network. As noted above, the underlying layer 202 may include a device layer that includes front-end-of-line devices, such as transistors and other active or passive circuit components. The conductive lines 902 may therefore provide electrical connectivity to such devices, through contacts and vias (not shown) that are accessible at the top surface of the underlying layer 202. For example, the two end-to-end conductive lines 904 and 906 may provide electrical connectivity to respective devices, or networks of devices, that are not in electrical communication with one another.

Additionally, any number of layers of conductive lines 902 may be formed on top of one another, for example by repeating the steps described above for a subsequent layer (not shown) above the dielectric layer 204. These additional layers of conductive lines may provide cross-communication, inter-layer communication, and electrical power to devices on the integrated chip. Thus, conductive lines 902 may make electrical contact with devices and conductive interconnects in other layers, with the term "electrical contact" referring to a conductive electrical connection between two structures. The conductive lines 902 may further provide electrical contact to device contacts, vias, and chip-to-package connections. On a final layer of a back-end-of-line stack, a passivating dielectric layer (not shown) may be deposited over the conductive lines 902 to prevent electrical shorts to off-chip structures.

Because the dielectric plug 502 is formed before the conductive lines 902, rather than being formed in a trench that is cut out of pre-existing lines, no plasma etch is needed to create this structure. As a result, the first dielectric layer 204 is relatively undamaged. Plasma damage to a dielectric material, particularly to a relatively fragile low-k dielectric material, can cause changes in molecular bonding configuration, the formation of a carbon-depleted layer, film shrinkage, and surface densification. This damage may, for example, cause a measurable increase in the dielectric constant k of the first dielectric layer 204, particularly in the region around the tips of the conductive lines 902. Thus, the material of the firsts dielectric layer 204 of the present embodiments does not suffer from carbon depletion, and can maintain a low dielectric constant.

Additionally, the present embodiments avoid the need for separate patterning processes when the tip-to-tip distance of conductive lines 902 is small. Photolithographic processes may not be able to resolve this tip-to-tip distance without touching the line ends. As a result, the tip-to-tip distance would otherwise be controlled by lithographic overlay tolerances between the two patterning processes. The use of multiple lithographic processes can introduce variability, as there may be a lack of precision when lining up two distinct photolithographic masks. Rather than suffering from such variability, and the lack of control over the tip-to-tip distance that would result, the formation of the dielectric plug 502 prior to conductive line formation means that one photolithographic process can be used, thereby providing superior patterning resolution and better control over the size of the dielectric plug 502.

Figure 10:
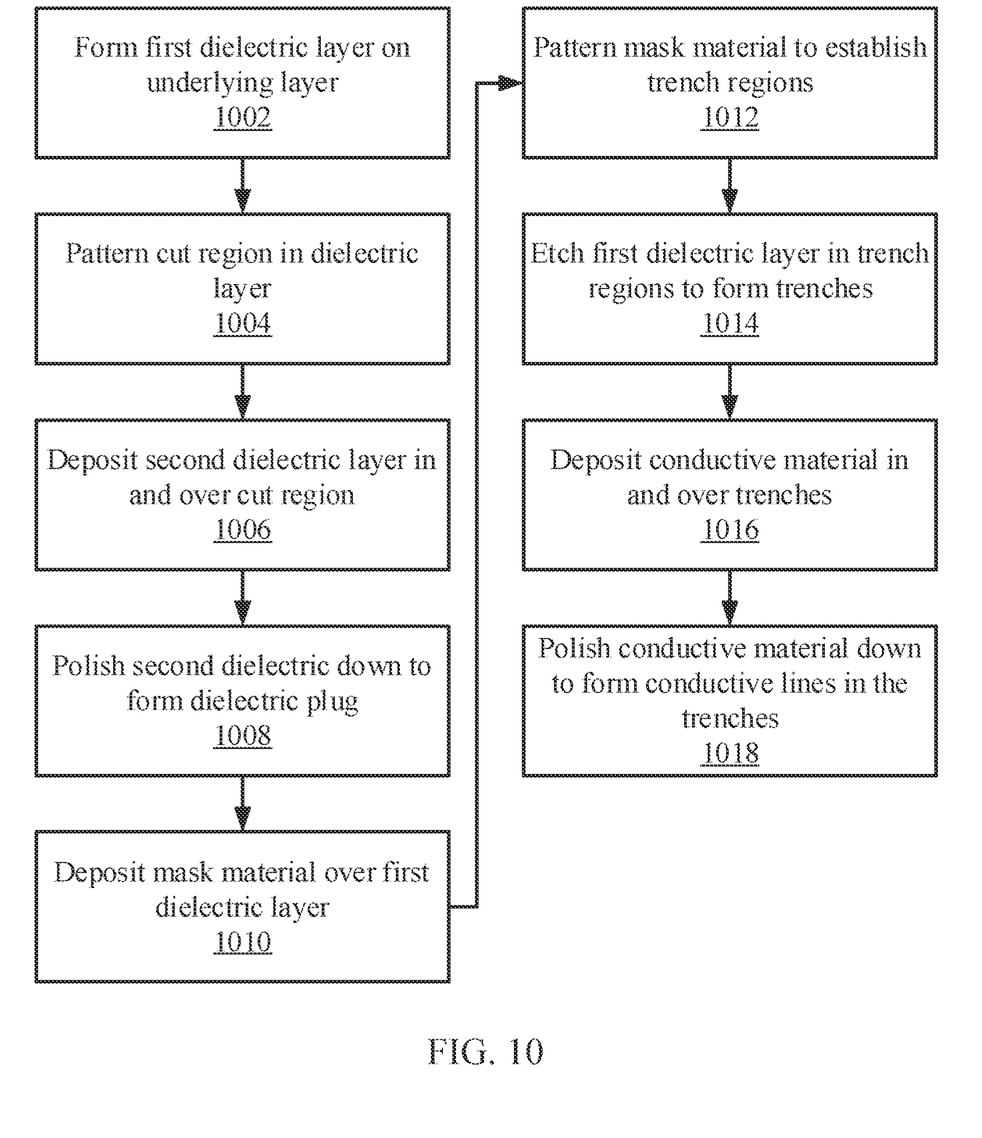
FIG. 10 is a block/flow diagram of a method for forming conductive lines in an integrated chip, using a line cut that is defined before the conductive lines are formed, in accordance with an embodiment of the present invention.

Referring now to FIG. 10, a method of forming conductive lines in, for example, a back-end-of-line layer of an integrated chip is shown. Block 1002 forms first dielectric layer 204 on underlying layer 202. As noted above, the underlying layer 202 may include a semiconductor substrate, a device layer, an interconnect layer, or any appropriate combination of these. The first dielectric layer 204 may be formed from any appropriate dielectric material, with low-k dielectric materials being specifically contemplated to reduce inter-line parasitic capacitance. The first dielectric layer 204 may be deposited using any appropriate deposition process, such as CVD, ALD, or PVD. The thickness of the first dielectric layer 204 may define the maximum height of the conductive lines that are to be formed.

Block 1004 patterns a cut region 104 in the first dielectric layer 204. This may be performed using any appropriate photolithographic process, for example by using photolithography to form a mask that exposes the cut region 104 above the first dielectric layer 204. Block 1004 then uses an anisotropic etch to etch down into the first dielectric layer 204. The etch of block 1004 may be selective, configured to stop on the underlying layer 202, or may be non-selective, such that some material is removed from the underlying layer 202. The cut region 104 may have a width that exceeds the width of the conductive lines that are to be formed, while being smaller than a spacing between adjacent line structures. Block 1004 may also remove the mask from the surface of the first dielectric layer 204.

Block 1006 deposits second dielectric material 402 in and over the cut region 104, using any appropriate deposition process, such as CVD, ALD, or PVD. The second dielectric material 402 may be formed from any appropriate dielectric material that has etch selectivity with respect to the material of the first dielectric layer 204. Block 1008 then polishes the second dielectric material 402 down to the height of the first dielectric layer 204, for example using a CMP process that stops on the material of the first dielectric layer 204, leaving behind the dielectric plug 502 in the cut region 104.

Block 1010 deposits mask material over the first dielectric layer 204 and the dielectric plug 502, and block 1012 patterns the mask material to form mask 602. Block 1012 may use any appropriate patterning process, such as photolithography, to form the mask 602, which may include trench regions 604. Block 1014 etches down into the first dielectric layer 204, using the trench regions 604 defined by the mask 602 as a guide, to form trenches 702 in the first dielectric layer 204. Block 1014 may use a selective anisotropic etch that stops on the underlying layer 202, such as a selective RIE, to remove material from the first dielectric layer 204 without damaging the dielectric plug 502.

Block 1016 deposits conductive material 802 in and over the trenches 702 using any appropriate deposition process, such as CVD, ALD, PVD, or GCIB. The conductive material 802 may include any metallic or non-metallic conductor, and may be formed to a height that exceeds the height of the dielectric layer 204. Block 1018 then polishes the conductive material 802 down to the height of the first dielectric layer 204, for example using a CMP process, thereby forming conductive lines 902.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The termninology used herein is for the purpose of describing particular embodiments only and is not intended to be limiting of example embodiments. As used herein, the singular forms "a" "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative teams are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it ill also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of line formation with cut-first tip definition (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:
1. A semiconductor device, comprising:
a dielectric layer, positioned on an underlying layer, having a plurality of trenches having a first size in a first dimension;
a dielectric plug, in a first trench of the plurality of trenches, separating the first trench into a pair of end-to-end trenches, the dielectric plug having a second size in the first dimension that is greater than the first size; and
conductive lines in the plurality of trenches.

2. The semiconductor device chip of claim 1, wherein the underlying layer includes front-end-of-line devices that electrically contact at least one of the conductive lines.

3. The semiconductor device of claim 1, wherein the dielectric layer includes a low-k dielectric layer that has not been depleted of carbon by an anisotropic etching process at an interface with the dielectric plug.

4. The semiconductor device of claim 1, wherein the dielectric plug includes a material selected from the group consisting of aluminum oxide, silicon nitride, and an aluminum oxide/silicon nitride bi-layer.

5. The semiconductor device of claim 1, wherein the dielectric plug is formed from a material that is different from a material of the dielectric layer.

6. The semiconductor device of claim 1, wherein the second width is less than 1.5 times a pitch between adjacent lines of the conductive lines.

7. The semiconductor device of claim 1, wherein the dielectric plug extends to a depth below a top surface of the underlying layer.

8. A semiconductor device, comprising:
- a dielectric layer, positioned on an underlying layer, having a plurality of trenches having a first size in a first dimension and being formed from a first dielectric material;
- a dielectric plug, in a first trench of the plurality of trenches, being formed from a second dielectric material different from the first dielectric material and separating the first trench into a pair of end-to-end trenches, the dielectric plug having a second size in the first dimension that is greater than the first size; and
- conductive lines in the plurality of trenches.

9. The semiconductor device of claim 8, wherein the underlying layer includes front-end-of-line devices that electrically contact at least one of the conductive lines.

10. The semiconductor device of claim 8, wherein the dielectric layer includes a low-k dielectric layer that has not been depleted of carbon by an anisotropic etching process at an interface with the dielectric plug.

11. The semiconductor device of claim 8, wherein the dielectric plug includes a material selected from the group consisting of aluminum oxide, silicon nitride, and an aluminum oxide/silicon nitride bi-layer.

12. The semiconductor device of claim 8, wherein the second width is less than 1.5 times a pitch between adjacent lines of the conductive lines.

13. The semiconductor device of claim 8, wherein the dielectric plug extends to a depth below a top surface of the underlying layer.

14. A semiconductor device, comprising:
- a dielectric layer, positioned on an underlying layer, having a plurality of trenches having a first size in a first dimension and being formed from a low-k dielectric layer that has not been depleted of carbon by an anisotropic etching process;
- a dielectric plug, in a first trench of the plurality of trenches, being formed from a material selected from the group consisting of aluminum oxide, silicon nitride, and an aluminum oxide / silicon nitride hi-layer, and separating the first trench into a pair of end-to-end trenches, the dielectric plug having a second size in the first dimension that is greater than the first size; and
- conductive lines in the plurality of trenches.

15. The semiconductor device of claim 14, wherein the underlying layer includes front-end-of-line devices that electrically contact at least one of the conductive lines.

16. The semiconductor device of claim 15, wherein the second width is less than 1.5 times a pitch between adjacent lines of the conductive lines.

17. The semiconductor device of claim 15, wherein the dielectric plug extends to a depth below a top surface of the underlying layer.

* * * * *